(12) United States Patent
Kojo

(10) Patent No.: US 9,237,668 B2
(45) Date of Patent: Jan. 12, 2016

(54) ELECTRONIC COMPONENT PACKAGE AND PIEZOELECTRIC RESONATOR DEVICE

(75) Inventor: Takuya Kojo, Kakogawa (JP)

(73) Assignee: DAISHINKU CORPORATION, Kakogawa-shi (JP)

( * ) Notice: Subject to any disclaimer, the term of this patent is extended or adjusted under 35 U.S.C. 154(b) by 189 days.

(21) Appl. No.: 13/881,175

(22) PCT Filed: Apr. 19, 2012

(86) PCT No.: PCT/JP2012/060589
§ 371 (c)(1),
(2), (4) Date: Apr. 24, 2013

(87) PCT Pub. No.: WO2012/172866
PCT Pub. Date: Dec. 20, 2012

(65) Prior Publication Data
US 2013/0214646 A1  Aug. 22, 2013

(30) Foreign Application Priority Data

Jun. 15, 2011 (JP) ................................. 2011-133602

(51) Int. Cl.
*H01L 41/053* (2006.01)
*H05K 5/06* (2006.01)
*H01L 23/10* (2006.01)
*B81B 7/00* (2006.01)

(52) U.S. Cl.
CPC ................ *H05K 5/061* (2013.01); *B81B 7/007* (2013.01); *H01L 23/10* (2013.01); *H01L 41/0533* (2013.01); *B81B 2201/0271* (2013.01); *H01L 2224/16225* (2013.01)

(58) Field of Classification Search
CPC ........................ H01L 41/053; H01L 41/01533

USPC .......................... 310/344, 348, 367, 368, 370
See application file for complete search history.

(56) References Cited

U.S. PATENT DOCUMENTS

| | | | |
|---|---|---|---|
| 6,507,139 B1* | 1/2003 | Ishino et al. | 310/348 |
| 2005/0040735 A1* | 2/2005 | Okajima | 310/348 |
| 2010/0026398 A1* | 2/2010 | Moriya et al. | 310/348 |

FOREIGN PATENT DOCUMENTS

| | | |
|---|---|---|
| JP | 2003-007892 A | 1/2003 |
| JP | 2007-274339 A | 10/2007 |
| JP | 2011-009399 A | 1/2011 |

* cited by examiner

*Primary Examiner* — Derek Rosenau
(74) *Attorney, Agent, or Firm* — Marvin A. Motsenbocker; Mots Law, PLLC

(57) ABSTRACT

In an electronic-component package made up of a laminated-ceramic, cavity-forming base and an electroconductive lid that is hermetically bonded to the base by a heat-melting sealant, contamination of electromagnetic-interference-reducing grounding metallization lines by melted sealant is prevented. A wall-portion grounding metallization line partially embedded in an enclosing wall portion of the base, and partially exposed to the package cavity, electrically connects lid, when sealant-bonded to the wall portion of the base, with a grounding external terminal on the base exterior. An electronic-component grounding metallization line exposed in the bottom of the base is connected to the grounding external terminal. A connecting portion that joins the wall-portion and electronic-component grounding metallization lines is disposed between laminations of the bottom and wall portions of the base, where the connecting portion is unexposed to the package cavity.

13 Claims, 6 Drawing Sheets

ELECTRONIC COMPONENT PACKAGE AND PIEZOELECTRIC RESONATOR DEVICE

TECHNICAL FIELD

The present invention relates to an electronic component package for hermetically sealing an electronic component element. The present invention also relates to a piezoelectric resonator device for hermetically sealing a piezoelectric element as the electronic component element.

BACKGROUND ART

In an electronic component, an internal space is hermetically sealed so that properties of an electronic component element mounted in the internal space are prevented from being deteriorated. Examples of known electronic component elements that require such hermetic seal include a semiconductor element and a piezoelectric element. Here, the electronic component includes, for example, a main body package made up of a base and a metal lid. In an internal space of the main body package, a semiconductor element, a piezoelectric element and the like are mounted (see, for example, Patent Document 1).

A package for electronic component storage described in Patent Document 1 is configured by bonding a metal lid to a box-shaped insulating substrate (base) in which electronic component elements are stored.

In such conventional art described in Patent Document 1, a GND line pattern is formed on the base so that the metal lid is grounded and thus electromagnetic interference (EMI) is reduced.

PRIOR ART REFERENCE

Patent Document

[Patent Document 1] JP2009-267866 A

SUMMARY OF INVENTION

Problems to be Solved by the Invention

The base and the metal lid are bonded together with a sealing member by heat-melting. Thus, the melted sealing member spreads not only on a sealing portion of the base but also on the GND line pattern. In such a case, the melted sealing member may further spread in the main body casing beyond the GND line pattern to make contact with the electronic component element (a semiconductor element and the like) or line patterns for other uses. This results malfunction in the electronic component element.

In order to solve the above-described problem, it is an object of the present invention to provide an electronic component package and a piezoelectric resonator device that prevent an electronic component element from malfunctioning due to contact with a sealing member.

Means for Solving the Problems

In order to achieve the above-described object, an electronic component package according to the present invention includes a base on which an electronic component element is mounted and a lid that is bonded to the base with a sealing member so as to hermetically seal the electronic component element. The lid includes a conductive member. The base includes a bottom portion and a wall portion that extends from the bottom portion. A cavity in which the electronic component element is mounted is formed on a first main surface of the base by the bottom portion and the wall portion. The base includes electrode pads electrically connected to electrodes of the electronic component element, external terminals electrically connected to outside and line patterns electrically connected to the electrode pads and the external terminals. The external terminals include a GND terminal for grounding. The line patterns include a wall portion GND line pattern that is formed on the wall portion to be exposed in the cavity so as to connect the lid to the GND terminal, and an electronic component element GND line pattern that is formed on the first main surface of the base in the cavity so as to connect the electronic component element to the GND terminal. A connecting portion, which connects the electronic component element GND line pattern to the wall portion GND line pattern, is disposed between layers of the bottom portion and the wall portion in plane view of the base, without being exposed in the cavity. For preferable configuration of the present invention, the connecting portion may be disposed between layers of the bottom portion and the wall portion, without being exposed in the cavity.

In the present invention, the base and the lid are bonded together with the sealing member. The lid includes a conductive member. The base is provided with the bottom portion and the wall portion so as to form the cavity. The base is also provided with the electrode pads, the external terminals and the line patterns. The external terminals include the GND terminal. The line patterns include the wall portion GND line pattern and the electronic component element GND line pattern. The connecting portion is disposed between the layers of the bottom portion and the wall portion in plane view of the base, without being exposed in the cavity. Therefore, the sealing member that has spread on the wall portion GND line pattern spreads no further. In the cavity, the sealing member that has spread on the wall portion GND line pattern does not transfer from the wall portion GND line pattern to the electronic component element GND line pattern. As a result, it is possible to prevent the sealing member that has spread, with a certain thickness, on the wall portion GND line pattern from directly making contact with the line patterns for other uses and the electronic component elements. Also, it is possible to ensure an internal clearance between the sealing member that has spread, with a certain thickness, on the wall portion GND line pattern and the electronic component elements. Consequently, it is possible to prevent malfunction in the electronic component elements due to contact of the sealing member with the electronic component elements.

Also, since the sealing member can be prevented from overflowing to the line patterns, it becomes possible to ensure a required amount of the sealing member for bonding the base and the lid together at a bonding area of the base and the lid. As a result, it is possible to reduce deterioration in bonding strength and in airtightness of the base and the lid.

In the above-described configuration, a recess portion may be provided in a wall surface of the wall portion in the cavity so that the wall portion GND line pattern is formed in the recess portion.

According to the present invention, it is suitable for reduction of the size of the electronic component package.

In the above-described configuration, a wall portion GND electrode, which is a part of the wall portion GND line pattern, may be formed on the bottom portion so that a portion of the wall portion GND electrode is exposed in the cavity. An outer end edge of the exposed portion of the wall portion GND electrode in the cavity may have a shape along the wall surface of the wall portion in the cavity, and an outer end edge of a non-exposed portion of the wall portion GND electrode may have a circular shape.

In such a case, the wall portion GND electrode is formed on the bottom portion. A portion of the wall portion GND electrode is exposed in the cavity. The outer end edge of the exposed portion of the wall portion GND electrode in the cavity has the shape along the wall surface of the wall portion in the cavity. The outer end edge of the non-exposed portion of the wall portion GND electrode has the circular shape. Thus, in such a configuration, it is possible to reduce the exposed portion, in the cavity, of the wall portion GND electrode in comparison with a configuration in which the center point of the wall portion GND electrode exists at the same position in plane view as the center point of the recess portion and the outer shape of the wall portion GND electrode has a regular circular shape. As a result, it is also possible to ensure an internal clearance between the sealing member that has spread, with a certain thickness, on the wall portion GND electrode and the electronic component elements. Consequently, it is possible to prevent the sealing member from making contact with the electronic component elements. Furthermore, it is possible to reduce an accumulation amount of the sealing member that has spread and accumulated on the wall portion GND electrode. Thus, it becomes possible to ensure a required amount of the sealing member for bonding the base and the lid together at the bonding area of the base and the lid. Also, it is possible to reduce deterioration in bonding strength and in airtightness of the base and the lid.

In the above-described configuration, a wall portion GND electrode, which is a part of the wall portion GND line pattern, may be formed on the bottom portion. An outer end edge of the wall portion GND electrode may have an ellipse shape, while one minor axis of the ellipse may be partially exposed in the cavity.

In such a case, the wall portion GND electrode is formed on the bottom portion. The outer end edge of the wall portion GND electrode has the ellipse shape, while one minor axis of the ellipse is partially exposed in the cavity. Thus, in such a configuration, it is possible to reduce the exposed portion, in the cavity, of the wall portion GND electrode in comparison with a configuration in which the center point of the wall portion GND electrode exists at the same position in plane view as the center point of the recess portion and the outer shape of the wall portion GND electrode has a regular circular shape. As a result, it is also possible to ensure an internal clearance between the sealing member that has spread, with a certain thickness, on the wall portion GND electrode and the electronic component elements. Consequently, it is possible to prevent the sealing member from making contact with the electronic component elements. Furthermore, it is possible to reduce an accumulation amount of the sealing member that has spread and accumulated on the wall portion GND electrode. Thus, it becomes possible to ensure a required amount of the sealing member for bonding the base and the lid together at the bonding area of the base and the lid. Also, it is possible to reduce deterioration in bonding strength and in airtightness of the base and the lid.

In the above-described configuration, a wall portion GND electrode, which is a part of the wall portion GND line pattern, may be formed on the bottom portion so that a portion of the wall portion GND electrode is exposed in the cavity. An outer end edge of the exposed portion of the wall portion GND electrode in the cavity may be a straight line, while an outer end edge of a non-exposed portion of the wall portion GND electrode may have a circular shape.

In such a case, the wall portion GND electrode is formed on the bottom portion. A portion of the wall portion GND electrode is exposed in the cavity. The outer end edge of the exposed portion of the wall portion GND electrode in the cavity is a straight line. The outer end edge of the non-exposed portion of the wall portion GND electrode has the circular shape. Thus, in such a configuration, it is possible to reduce the exposed portion, in the cavity, of the wall portion GND electrode in comparison with a configuration in which the center point of the wall portion GND electrode exists at the same position in plane view as the center point of the recess portion and the outer shape of the wall portion GND electrode has a regular circular shape. As a result, it is also possible to ensure an internal clearance between the sealing member that has spread, with a certain thickness, on the wall portion GND electrode and the electronic component elements. Consequently, it is possible to prevent the sealing member from making contact with the electronic component elements. Furthermore, it is possible to reduce an accumulation amount of the sealing member that has spread and accumulated on the wall portion GND electrode. Thus, it becomes possible to ensure a required amount of the sealing member for bonding the base and the lid together at the bonding area of the base and the lid. Also, it is possible to reduce deterioration in bonding strength and in airtightness of the base and the lid.

In order to achieve the above-described object, a piezoelectric resonator device of the present invention has a configuration in which a piezoelectric element as an electronic component element is hermetically sealed in the electronic component package of the present invention.

According to the present invention, the piezoelectric element is hermetically sealed in the electronic component package of the present invention. Thus, the piezoelectric resonator device of the present invention can obtain actions and effects of the electronic component package of the present invention.

Effects of the Invention

According to the present invention, it is possible to prevent the electronic component element from malfunctioning due to contact with the sealing member.

MODES FOR CARRYING OUT THE INVENTION

Hereinafter, embodiments of the present invention will be described with reference to the drawings. In the embodiments described below, the present invention is applied to an oscillator, i.e. a piezoelectric resonator device, as an electronic component. The present invention is also applied to an AT-cut crystal oscillator piece and an IC chip as electronic component elements.

First Embodiment

Figure 1:
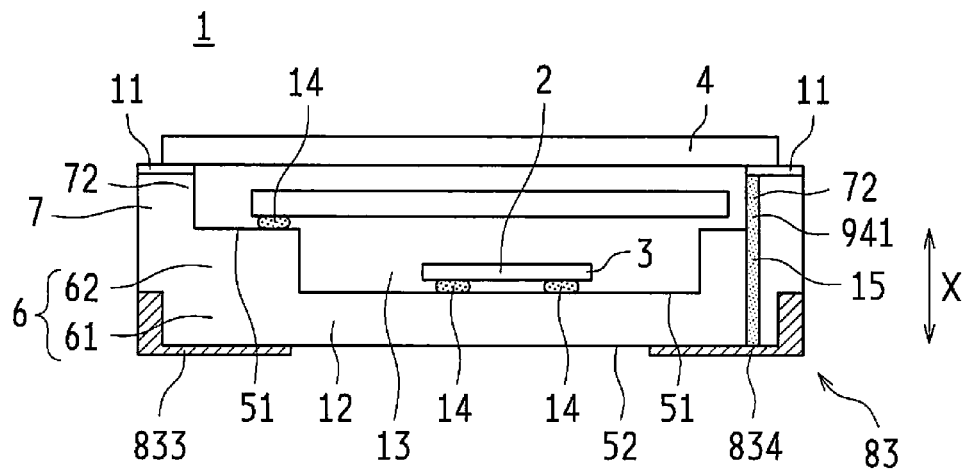
FIG. 1 is a schematic cross-sectional view of an opened internal space of an oscillator according to the first embodiment of the present invention.
Figure 2:
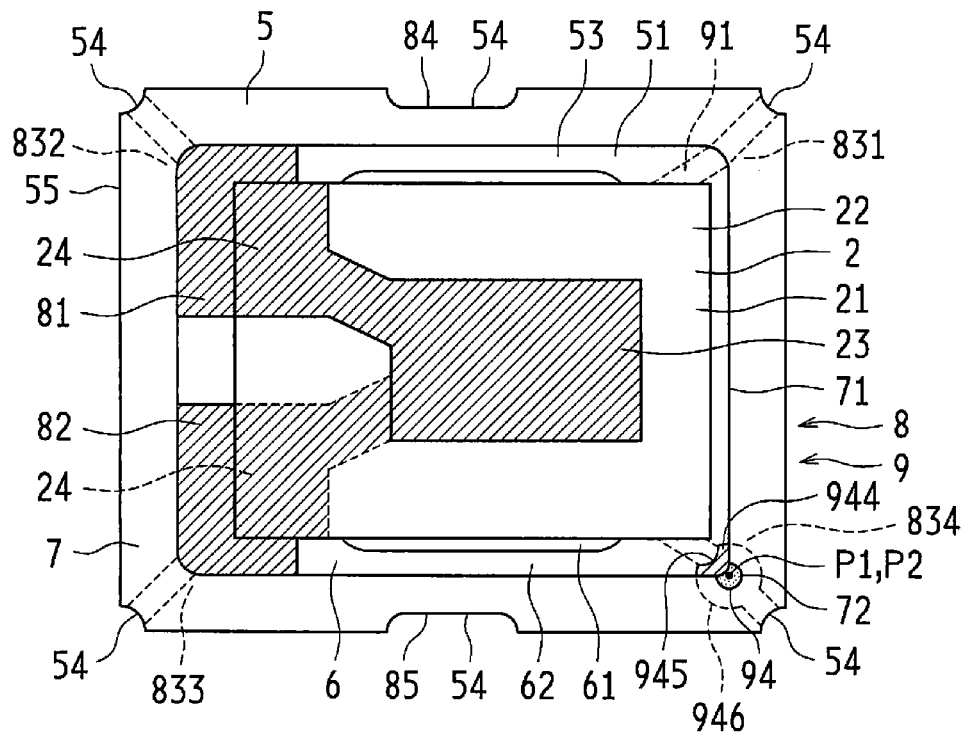
FIG. 2 is a schematic plane view of a base on which a crystal oscillator piece and an IC chip are mounted according to the first embodiment of the present invention.
Figure 3:
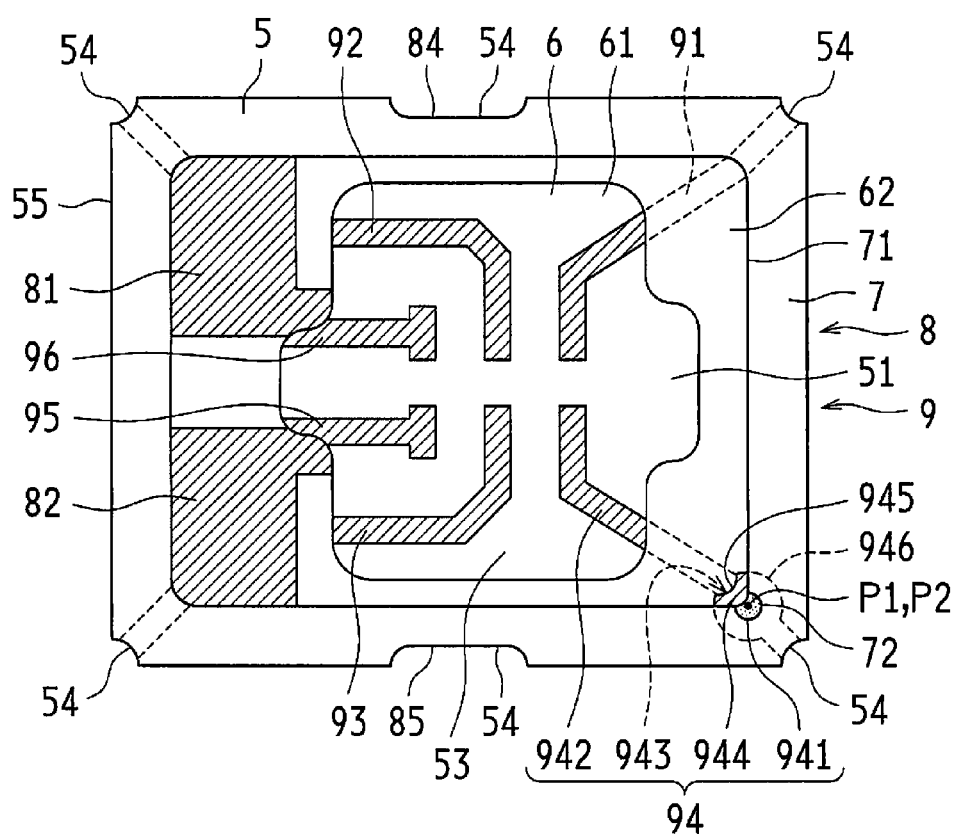
FIG. 3 is a schematic plane view of the base according to the first embodiment of the present invention.

As shown in FIGS. 1 to 3, an oscillator 1 according to the first embodiment includes an AT-cut crystal oscillator piece 2 (an electronic component element of the present invention; hereinafter referred to as the "crystal oscillator piece") as a piezoelectric element, an IC chip 3 (an electronic component element of the present invention) as a one-chip integrated circuit element (an integrated circuit element) that constitutes an oscillation circuit with the crystal oscillator piece 2, a base 5 on which the crystal oscillator piece 2 and the IC chip 3 are mounted and held and a metal lid 4 (a lid of the present invention; hereinafter referred to as the "lid") that hermetically seals the crystal oscillator piece 2 and the IC chip 3, the crystal oscillator 2 and the IC chip 3 being held on a first main surface 51 of the base 5.

In this oscillator 1, a main body casing 12 (an electronic component package of the present invention) includes the base 5 and the lid 4 bonded together with a sealing member 11 by heat-melting. A hermetically sealed internal space 13 is formed in the main body casing 12 by such a bonding.

As shown in FIG. 1, the crystal oscillator piece 2 is bonded and electrically connected (electrically and mechanically connected) to the first main surface 51 of the base 5 (the surface of the base 5 in plane view) in the internal space 13 of the main body casing 12 with a conductive adhesive 14 (a conductive resin adhesive, a metal bump, a plating bump and the like). Also as shown in FIG. 1, the IC chip 3 is bonded and electrically connected (electrically and mechanically connected) to the first main surface 51 of the base 5 in the internal space 13 with the conductive adhesive 14 (a metal bump, a plating bump and the like). As the conductive adhesive 14 in the first embodiment, a conductive resin adhesive such as silicon resin, a metal bump such as an Au bump and a plating bump are used. As the sealing member 11, an Ag brazing material, a Ni plating material, an Au—Sn alloy and the like are used.

Next, components of the main body casing 12 of the oscillator 1 will be described.

The base 5 is formed by laminating ceramic material layers. Specifically, as shown in FIGS. 1 to 3, the base 5 is formed in a box shape defined by a bottom portion 6 and a wall portion 7 that extends upward from the bottom portion 6 along an outer periphery of the first main surface 51 of the base 5. A cavity 53 is formed on the first main surface 51 of the base 5 so as to be enclosed by the bottom portion 6 and the wall portion 7. The IC chip 3 and the crystal oscillator piece 2 are mounted in the cavity 53. The bottom portion 6 includes a step portion 62. The bottom portion 6 is formed as a two-stage laminated body constituted by a bottom surface portion 61 and the step portion 62. The base 5 is formed by laminating a plurality of annular ceramic plates (corresponding to the step portion 62 and the wall portion 7) and a conductive material for electrodes 8 on a single ceramic plate (corresponding to the bottom surface portion 61), with being integrally baked in a recessed shape (in cross-sectional view).

In the cavity 53 of the base 5, the IC chip 3 is electrically and mechanically connected to line patterns 9 on the bottom surface portion 61 (see below) with six conductive adhesives 14. The crystal oscillator piece 2 is held at one end thereof on the step portion 62, thus the crystal oscillator piece 2 and the step portion 62 are electrically and mechanically connected. The base 5 is provided with, on both ends thereof in the longitudinal direction, respective step portions 62. On one step portion 62, electrode pads 81, 82 are formed so as to be connected to the crystal oscillator piece 2. The other step portion 62 serves as a bolster portion for preventing the crystal oscillator piece 2 from being held tilted.

In the first embodiment, thus the crystal oscillator piece 2 and the IC chip 3 are disposed in the cavity 53 in a laminated manner.

The base 5 has a top surface on the wall portion 7 as a bonding surface with respect to the lid 4. The bonding surface is provided with a first bonding layer (not shown) to be bonded to the lid 4. The first bonding layer has a laminated structure of a plurality of layers, i.e. metallized layers (not shown) such as of W and Mo, a Ni film made of Ni, and a Au film made of Au, which are laminated in this order, on the top surface of the wall portion 7 of the base 5. The metallized layers are integrally baked at the time of ceramic baking after printing of the metallization materials. The Ni film and the Au film are formed by plating technology.

As shown in FIG. 2, the base 5 has castellations 54 on four corners and middle points of the long side of the rear surface (a second main surface 52) of the casing. These castellations 54 are cutouts having an arc shape (half-circle recessed shape) and extend toward an X direction (the height direction of the base 5 as shown in FIG. 1) on a casing side surface 55.

In the cavity 53, a recess portion 72 is provided in a wall surface 71 of the wall portion 7. The recess portion 72 is a cutout having an arc shape (half-circle recessed shape) and extends in the X direction from the top surface of the wall portion 7 along a surface that makes contact with the bottom portion 6 (more specifically, the step portion 62). In the recess portion 72, a wall portion GND line pattern 941 (see below) is formed.

As shown in FIGS. 1-3, the electrodes 8 of the base 5 include a pair of electrode pads 81, 82 for the crystal oscillator piece 2, electrode pads for the IC chip 3 (not shown), external terminals 83 and inspection terminals 84, 85. The electrode pads 81, 82 for the crystal oscillator piece 2 are electrically connected to respective excitation electrodes 24, 24 of the crystal oscillator piece 2. The electrode pads for the IC chip 3 are electrically connected to terminals of the IC chip 3 (not shown). The external terminals 83 are electrically connected to an external device such as an external circuit board (not shown) with a conductive adhesive (not shown) such as a solder (not shown). The inspection terminals 84, 85 are to measure and inspect properties of the crystal oscillator piece 2. In the first embodiment, the external terminals 83 include an altering current output terminal 831 of the IC chip 3, a direct current power source terminal 832 of the IC chip 3, a direct current control terminal 833 of the IC chip 3 and a GND terminal 834 for grounding (a ground terminal).

The pair of electrode pads 81, 82 for the crystal oscillator piece 2 is formed on the first main surface 51 of the base 5 at the step portion 62 in the cavity 53. The electrode pads for the IC chip 3 are formed in a matrix shape on the first main surface 51 of the base 5 at the bottom surface portion 61 in the cavity 53. In the first embodiment, the electrode pads for the IC chip 3 are formed in a matrix (2×3; m×n). The external terminals 83 (the altering current output terminal 831, the direct current power source terminal 832, the direct current control terminal 833 and the GND terminal 834) are formed on the respective castellations 54 in an area corresponding to the wall portion (in the outer periphery) of the second main surface 52. The inspection terminals 84, 85 are formed on respective portions of the side surfaces of the main body casing 12 (the side surfaces of the respective castellations 54).

In the electrodes 8 of the base 5 in the above-described configuration, the electrode pads 81, 82, the external terminals 83 and the inspection terminals 84, 85 are electrically connected to each other via the line patterns 9.

As shown in FIGS. 1 to 3, the line patterns 9 include: an output line pattern 91 to provide continuity between the electrode pad for alternating current output of the IC chip 3 and the alternating current output terminal 831 of the IC chip 3; a power source line pattern 92 to provide continuity between the electrode pad for the direct power source of the IC chip 3 and the direct power source terminal 832; a control line pattern 93 to provide continuity between the electrode pad for direct current control of the IC chip 3 and the direct current control terminal 833; a GND line pattern 94 to provide continuity between the electrode pad for grounding of the IC chip 3 and the GND terminal 834; a crystal line pattern 95 to provide continuity between the electrode pad for inspection, and the inspection terminal 84 and the electrode pad 81; and a crystal line pattern 96 to provide continuity between the electrode pad for inspection, and the inspection terminal 85 and the electrode pad 82.

As shown in FIG. 3, the GND line pattern 94 includes: the wall portion GND line pattern 941, which is formed on the wall portion 7, to connect the lid 4 to the GND terminal 834; and an electronic component element GND line pattern 942, which is formed on the first main surface 51 in the cavity 53, to connect the IC chip 3 to the GND terminal 834. The electronic component element GND line pattern 942 and the wall portion GND line pattern 941 are connected via a connecting portion 943. The connecting portion 943 is disposed between layers of the bottom portion 6 and the wall portion 7, without being exposed in the cavity 53. In the first embodiment, the electronic component element GND line pattern 942 is formed on the bottom surface portion 61 and the wall portion GND line pattern 941 is formed on the bottom surface portion 61, the step portion 62 and the wall portion 7.

On the step portion 62 (the first main surface 51 of the base 5), a wall portion GND electrode 944, which is a part of the wall portion GND line pattern 941, is formed. The wall portion GND electrode 944 is partially exposed in the cavity 53. Such an exposed portion of the wall portion GND electrode 944 in the cavity 53 has a fan shape. As shown in FIGS. 2 and 3, an outer end edge 945 of the exposed portion has a curved shape along the wall surface 71 of the wall portion 7 in the cavity 53. On the other hand, an outer end edge 946 of a non-exposed portion of the wall portion GND electrode 944 has a regular circular shape. Furthermore, a center point P1 of the recess portion 72 exists at the same position in plane view as a center point P2 of the wall portion GND electrode 944. Also, as shown in FIGS. 1 to 3, the recess portion 72, on which is formed the wall portion GND line pattern 941, is filled with a conductive member 15 composed of Cu, W, Mo and the like. The conductive member 15 is included in the wall portion GND line pattern 941.

The electrodes 8 of the base 5 are integrally baked with the base 5 after printing of metallization materials such as W and Mo. Among the electrodes 8, the electrode pads 81, 82, the external terminals 83 and the inspection terminals 84, 85 each have Ni plating formed over the corresponding metallized layer and Au plating formed over the corresponding Ni plating. Here, examples of the plating method include electrolytic plating and non-electrolytic plating.

As shown in FIG. 1, the lid 4 is made of a mother material of Kovar (a conductive material) in the shape of a plate. A nickel layer (not shown) is formed on each main surface of the Kovar material. On one main surface thereof, an Au—Sn alloy layer is further formed. Also, the sealing member 11 according to the first embodiment, which is used for connecting the base 5 to the lid 4, is formed with the Au—Sn alloy layer of the lid 4. The external dimension of the lid 4 is smaller than that of the base 5. A thermal buffer layer containing copper as a main component may be formed between the nickel layer and the Kovar material of the lid 4, as required.

As shown in FIGS. 1 to 3, in the oscillator 1 in the above-described configuration, the IC chip 3 is disposed on the bottom surface portion 61 in the cavity 53 of the base 5. The IC chip 3 is electrically and mechanically connected to the electrode pads for the IC chip 3 with the conductive adhesive 14 using ultrasonic flip chip bonding (FCB). After that, the crystal oscillator piece 2 is disposed on the step portion 62 in the cavity 53 of the base 5 so as to be electrically and mechanically connected to the electrode pads 81, 82 with the conductive adhesive 14.

Then, the lid 4 is disposed on the base 5 that includes the IC chip 3 and the crystal oscillator piece 2 mounted in the cavity 53. After that, the sealing member 11 formed on the lid 4 is bonded to the first bonding layer of the base 5 by heat-melting, thus the oscillator 1 in which the crystal oscillator piece 2 and the IC chip 3 are hermetically sealed is fabricated, as shown in FIG. 1. The oscillator 1 thus fabricated is mounted on an external circuit board with a conductive adhesive such as a solder. In this specification, the reference numeral 11 indicates the sealing member for convenience sake. Actually, the member indicated by the reference numeral 11 contains the first bonding layer. In FIG. 1, the reference numeral 11 indicates both the first bonding layer and the sealing member after bonding of the base 5 to the lid 4.

The crystal oscillator piece 2 is a substrate 21 made of an AT-cut crystal piece. The substrate 21 of the crystal oscillator piece 2 is a single plate having a rectangular parallelepiped shape, as shown in FIG. 2. A pair of excitation electrodes 23, 23 is respectively formed, in an opposite manner, on both main surfaces 22, 22 of the substrate 21. Extraction electrodes 24, 24 are extracted from the respective excitation electrodes 23, 23 so that the excitation electrodes 23, 23 are electrically and mechanically connected to the external electrodes (in the present embodiment, the electrode pads 81, 82 of the base 5). Thus, the excitation electrodes 23, 23 are electrically and mechanically connected to the electrode pads 81, 82 of the base 5 via the extraction electrodes 24, 24 and the conductive adhesive 14, as shown in FIG. 1. The excitation electrodes 23, 23 and the extraction electrodes 24, 24 are formed by vacuum deposition, sputtering and the like. For example, they are formed by laminating, at least, an underlying metal such as chrome and an electrode such as gold and silver, in this order, to the substrate 21.

As described above, with the oscillator 1 and the main body casing 12 according to the first embodiment, the base 5 and the lid 4 are bonded together with the sealing member 11. The lid 4 includes the conductive material. The base 5 is provided with the bottom portion 6, the wall portion 7, the cavity 53, the electrodes 8 (including the external terminals 83) and the line patterns 9. The external terminals 83 include the GND terminal 834. The line patterns 9 include the wall portion GND line pattern 941 and the electronic component element GND line pattern 942. The connecting portion 943 is disposed between the layers of the bottom portion 6 and the wall portion 7, thus it is not exposed in the cavity 53. Therefore, the sealing member 11 that has spread on the wall portion GND line pattern 941 spreads no further. In the cavity 53, the sealing member 11 that has spread on the wall portion GND line pattern 941 does not transfer from the wall portion GND line pattern 941 to the electronic component element GND line pattern 942. As a result, it is possible to prevent the sealing member 11 that has spread, with a certain thickness, on the wall portion GND line pattern 941 from directly making contact with the line patterns for other uses (i.e. the output line pattern 91, the power source line pattern 92, the control line pattern 93 and the crystal line patterns 95, 96) and the electronic component elements (i.e. the crystal oscillator piece 2 and the IC chip 3). At the same time, it is possible to ensure an internal clearance between the sealing member 11 that has spread, with a certain thickness, on the wall portion GND line pattern 941 and the electronic component elements such as the crystal oscillator piece 2 and the IC chip 3. Consequently, it is possible to prevent malfunction in the electronic component elements due to contact of the sealing member 11 with the electronic component elements.

Also, in the present embodiment, since the sealing member 11 can be prevented from overflowing to the electronic component element GND line pattern 942, it becomes possible to ensure a required amount of the sealing member 11 for bonding the base 5 to the lid 4 at the bonding area of the base 5 and the lid 4. As a result, it is possible to reduce deterioration in bonding strength and in airtightness of the base 5 and the lid 4.

Furthermore, the oscillator 1 has a characteristic suitable for reduction of its size. According to the present embodiment, the recess portion 72 is formed in the wall surface 71 of the wall portion 7 in the cavity 53. The wall portion GND line pattern 941 is formed in the recess portion 72, which can suppress noise. Such a configuration is effective for countermeasures against electromagnetic interference (EMI) that accompanies miniaturization of the oscillator 1. Especially, such an effect is associated with the use of the conductive material for the lid 4. In addition, the base 5 (e.g. an area between the bottom portion 6 and the wall portion 7 of the base 5) according to the present embodiment may be provided with a member made of a conductive material (e.g. a conductive member having a plate shape). Such a configuration is also effective for countermeasures against electromagnetic interference (EMI) that accompanies miniaturization of the oscillator 1.

The wall portion GND electrode 944 is formed on the bottom portion 6, and a portion of the wall portion GND electrode 944 is exposed in the cavity 53. The outer end edge 945 of the exposed portion of the wall portion GND electrode 944 in the cavity 53 has a shape along the wall surface 71 of the wall portion 7 in the cavity 53. The outer end edge 946 of the non-exposed portion of the wall portion GND electrode 944 has a circular shape. Thus, in such a configuration, it is possible to reduce the exposed portion, in the cavity 53, of the wall portion GND electrode 944 in comparison with a configuration in which the center point of the wall portion GND electrode 944 exists at the same position in plane view as the center point of the recess portion and the outer shape of the wall portion GND electrode 944 has a regular circular shape. As a result, it is also possible to ensure an internal clearance between the sealing member 11 that has spread, with a certain thickness, on the wall portion GND electrode 944 and the electronic component elements such as the crystal oscillator piece 2 and the IC chip 3. Consequently, it is possible to prevent the electronic component elements from making contact with the sealing member 11. Furthermore, it is possible to reduce an accumulation amount of the sealing member 11 that has spread and accumulated on the wall portion GND electrode 944. Thus, it becomes possible to ensure a required amount of the sealing member 11 for bonding the base 5 to the lid 4 at the bonding area of the base 5 and the lid 4. Also, it is possible to reduce deterioration in bonding strength and in airtightness of the base 5 and the lid 4.

In the first embodiment, while a crystal oscillator is applied as the piezoelectric resonator device, the material should not be limited to the crystal. Any piezoelectric material can be applied. Also, the oscillator should not be limited to the crystal oscillator according to the first embodiment. For example, an oscillator using a surface acoustic wave element may be applied.

Also, in the first embodiment, a four-terminal configuration is applied. That is, the external terminals 83 include the altering current output terminal 831 of the IC chip 3, the direct current power source terminal 832 of IC chip 3, the direct current control terminal 833 of IC chip 3 and the GND terminal 834 of IC chip 3. However, the present invention should not be limited thereto. For example, another four-terminal configuration may be applied, which includes a voltage control terminal instead of the direct current control terminal 833. Also, instead of the direct current control terminal 833, a dummy terminal that does not function as a terminal to be connected to outside may be formed for another four-terminal configuration. Also, a configuration with five or more terminals may be applied, which includes two or more terminals out of the direct current control terminal 833, the voltage control terminal and the dummy terminal. A configuration with six or more terminals may also be applied, which includes another write terminal and the like in addition to the external terminals 83.

In the first embodiment and the second embodiment, the sealing member 11 is formed on the lid 4 before the bonding of the base 5 to the lid 4. However, the present invention should not be limited thereto. The sealing member 11 may also be formed on the base 5.

Second Embodiment

Next, an oscillator 1 according to the second embodiment will be described with reference to the drawings. The oscillator 1 of the second embodiment is different from that of the first embodiment in the shape of a base 5. Thus, where the oscillator 1 of the second embodiment has a configuration in common with that of the first embodiment, the actions, effects and modification examples of the second embodiment are similar to those of the first embodiment. In view of this, in the second embodiment, a description will be given with respect to the base 5 in different aspects from the second embodiment described above, while a description will be omitted with respect to the common aspects.

Figure 4:
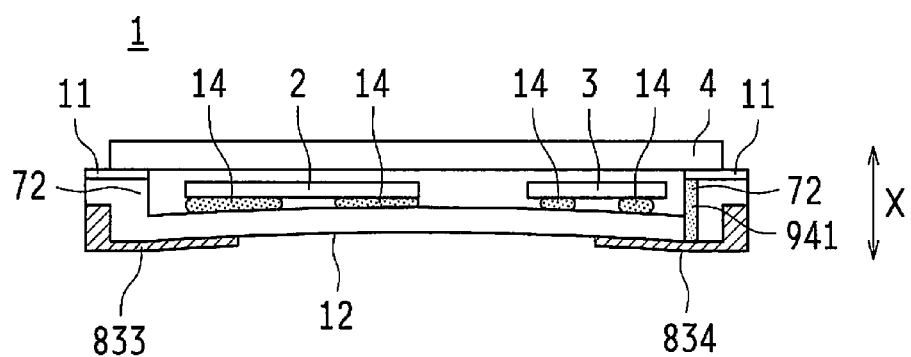
FIG. 4 is a schematic cross-sectional view of an opened cavity of an oscillator according to the second embodiment of the present invention.
Figure 5:
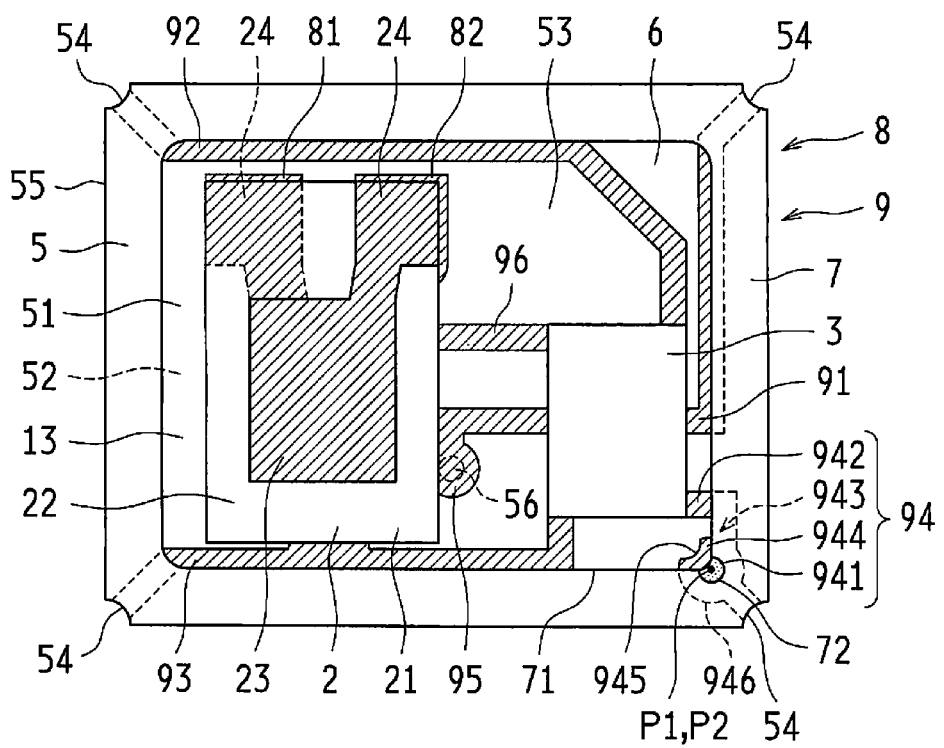
FIG. 5 is a schematic plane view of a base on which a crystal oscillator piece and an IC chip are mounted according to the second embodiment of the present invention.
Figure 6:
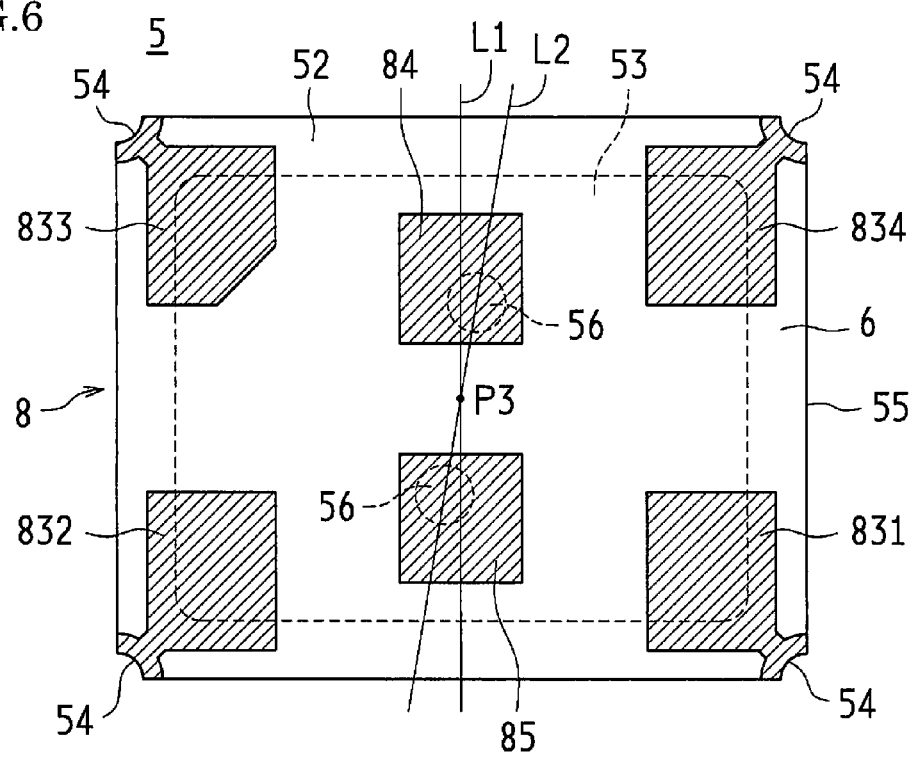
FIG. 6 is a schematic rear view of the base according to the second embodiment of the present invention.

As shown in FIGS. 4 to 6, the oscillator 1 according to the second embodiment is provided with a crystal oscillator piece 2, an IC chip 3, a base 5 and a lid 4. The crystal oscillator piece 2 is hermetically sealed in a main body casing 12 that is configured by the base 5 and the lid 4 to be an electronic component package.

Next, a description will be given of the base 5 characterizing the configuration of the second embodiment with reference to FIGS. 4 to 6.

The base 5 is made of a ceramic base material such as alumina. As shown in FIGS. 4 and 5, the base 5 is formed in a box shape defined by a bottom portion 6 and a wall portion 7 that extends upward from the bottom portion 6 along an outer periphery of a first main surface 51 of the base 5. The base 5 is formed by laminating a plurality of annular ceramic plates (corresponding to the wall portion 7) and a conductive material of electrodes 8 on a single ceramic plate (corresponding to the bottom portion 6), with being integrally baked in a recessed shape (in cross-sectional view).

A cavity 53 in which are mounted the crystal oscillator piece 2 and the IC chip 3 is formed on the first main surface 51 of the base 5 so as to be enclosed by the bottom portion 6 and the wall portion 7. The crystal oscillator piece 2 and the IC chip 3 are mounted side by side, with their long-side directions being in the same direction, on the bottom portion 6 (the first main surface 51 of the base 5) in the cavity 53.

The base 5 has a top surface on the wall portion 7 as a bonding surface with respect to the lid 4. The bonding surface is provided with a first bonding layer (not shown) to be bonded to the lid 4. The first bonding layer has a laminated structure of a plurality of layers, i.e. metallized layers (not shown) such as of W and Mo, a Ni film made of Ni, and a Au film made of Au, which are laminated in this order, on the top surface of the wall portion 7 of the base 5. The metallized layers are integrally baked at the time of ceramic baking after printing of the metallization materials. The Ni film and the Au film are formed by plating technology As shown in FIGS. 4 to 6, the base 5 has castellations 54 on four corners of the rear surface (a second main surface 52) of the casing. The castellations 54 are cutouts having an arc shape (half-circle recessed shape) and extend toward an X direction (the height direction of the base 5 as shown in FIG. 4) on a casing side surface 55.

As shown in FIGS. 5 and 6, the base 5 is provided with two via holes 56 for leading out excitation electrodes 23, 23 of the crystal oscillator piece 2 from inside to outside of the cavity 53. That is, the two via holes 56 pass through from the first main surface 51 to the second main surface 52 of the base 5.

The via holes 56 are inclined relative to any side of the base 5. The via holes 56 are arranged side by side in a direction (see line L2 in FIG. 6) inclined by the angle θ (5 to 30 degrees) relative to the short-side direction (see line L1 in FIG. 6) of the base. Also, the two via holes 56 are formed in a region of the second main surface 52 other than the region corresponding to the wall portion 7 formed on the first main surface 51 (such a corresponding region is hereinafter referred to as a "wall portion corresponding region"). That is, the two via holes 56 are formed in the region of the second main surface 52 corresponding to the bottom portion 6 in the cavity 53 formed on the first main surface 51 (such a corresponding region is hereinafter referred to as a "cavity corresponding region").

The via holes 56 are filled with a conductive member (not shown) composed of Cu, W, Mo and the like.

In the cavity 53, a recess portion 72 is provided in a wall surface 71 of the wall portion 7. The recess portion 72 is a cutout having an arc shape (half-circle recessed shape) and extends in the X direction from the top surface of the wall portion 7 along a surface that makes contact with the bottom portion 6. The recess portion 72 is filled with a conductive member 15 composed of W-paste, Mo-paste and the like. A wall portion GND line pattern 941 (see below) is formed on a surface of the conductive member 15 filled in the recess portion 72. The above surface faces the cavity 53.

As shown in FIG. 5, the electrodes 8 of the base 5 include a pair of electrode pads 81, 82 for the crystal oscillator piece 2, electrode pads (not shown) for the IC chip 3, external terminals 83 and inspection terminals 84, 85. The electrode pads 81, 82 for the crystal oscillator piece 2 are electrically connected to respective excitation electrodes 23, 23 of the crystal oscillator piece 2. The electrode pads for the IC chip 3 are electrically connected to terminals of the IC chip 3 (not shown). The external terminals 83 are electrically connected to an external device such as an external circuit board (not shown) with a conductive adhesive (not shown) such as a solder. The inspection terminals 84, 85 are to measure and inspect properties of the crystal oscillator piece 2. In the present embodiment, the external terminals 83 include an altering current output terminal 831 of the IC chip 3, a direct current power source terminal 832 of the IC chip 3, a direct current control terminal 833 of the IC chip 3 and a GND terminal 834 for grounding of the IC chip 3 (a ground terminal).

As shown in FIGS. 4 and 5, the electrode pads 81, 82 for the crystal oscillator piece 2 are formed on the first main surface 51 of the base 5 (specifically, on the bottom portion 6 in the cavity 53). On the bottom portion 6 in the cavity 53, the electrode pads 81, 82 are disposed in the vicinity of a power source line pattern 92 (see below) and a control line pattern 93 (see below) rather than in the vicinity of an output line pattern 91 (see below) and a GND line pattern 94 (see below). In other words, the electrode pads 81, 82 are disposed in the vicinity of the power source line pattern 92 and the control line pattern 93 and are spaced apart from the output line pattern 91 and the GND line pattern 94.

The electrode pads for the IC chip 3 are formed in a matrix shape on the first main surface 51 of the base 5 at the bottom portion 6 in the cavity 53. In the present embodiment, the electrode pads for the IC chip 3 are formed in a matrix (2×3; m×n).

The external terminals 83 (the altering current output terminal 831, the direct current power source terminal 832, the direct current control terminal 833 and the GND terminal 834) are each formed on the wall portion corresponding region of the second main surface 52 (an outer periphery of the second main surface 52). Specifically, as shown in FIG. 6, the altering current output terminal 831, the direct current power source terminal 832, the direct current control terminal 833 and the GND terminal 834 are formed in the respective corners and castellations 54 of the second main surface 52.

The inspection terminals 84, 85 are formed on the second main surface 52 at respective positions opposed to the cavity (respective center positions other than the outer periphery of the second surface 52). That is, the inspection terminals 84, 85 are formed only in the cavity corresponding region of the second main surface 52 (a center region other than the outer periphery of the second main surface 52), as shown in FIG. 6. More specifically, the inspection terminals 84, 85 are arranged at an intermediate location in the long-side direction of the second main surface 52 and are arranged side by side along a shot-side direction of the second main surface 52. The via holes 56 are formed under the respective inspection terminals 84, 85.

In the electrodes 8 of the base 5 in the above-described configuration, the electrode pads 81, 82, the external terminals 83 and the inspection terminals 84, 85 are electrically connected to each other via the line patterns 9.

As shown in FIG. 5, the line patterns 9 include: the output line pattern 91 to provide continuity between the electrode pad for alternating current output of the IC chip 3 and the alternating current output terminal 831 of the IC chip 3; the power source line pattern 92 to provide continuity between the electrode pad for direct power source of the IC chip 3 and the direct power source terminal 832; the control line pattern 93 to provide continuity between the electrode pad for direct current control of the IC chip 3 and the direct current control terminal 833; the GND line pattern 94 to provide continuity between the electrode pad for grounding of the IC chip 3 and the GND terminal 834; a crystal line pattern 95 to provide continuity between the electrode pad for inspection, and the inspection pad 84 and the electrode pad 81; and a crystal line pattern 96 to provide continuity between the electrode pad for inspection, and the inspection pad 85 and the electrode pad 82.

As shown in FIGS. 4 and 5, the GND line pattern 94 includes: the wall portion GND line pattern 941, which is formed on the wall portion 7, to connect the lid 4 to the GND terminal 834; and an electronic component element GND line pattern 942, which is formed on the first main surface 51 in the cavity 53, to connect the IC chip 3 to the GND terminal 834. The electronic component element GND line pattern 942 and the wall portion GND line pattern 941 are connected to each other with a connecting portion 943. The connecting portion 943 is disposed between layers of the bottom portion 6 and the wall portion 7, without being exposed in the cavity 53. In the second embodiment, the electronic component element GND line pattern 942 and the wall portion GND line pattern 941 are disposed adjacent to each other in the cavity 53. However, since the connecting portion 943 is disposed between the layers of the bottom portion 6 and the wall portion 7, the electronic component element GND line pattern 942 and the wall portion GND line pattern 941 are not connected to each other in the cavity 53.

On the bottom portion 6 (the first main surface 51 of the base 5), a wall portion GND electrode 944, which is a part of the wall portion GND line pattern 941, is formed. The wall portion GND electrode 944 is partially exposed in the cavity 53. Such an exposed portion of the wall portion GND electrode 944 in the cavity 53 has a fan shape. As shown in FIG. 5, an outer end edge 945 of the exposed portion in the cavity 53 has a curved shape along the wall surface 71 of the wall portion 7 in the cavity 53. On the other hand, an outer end edge 946 of a non-exposed portion of the wall portion GND electrode 944 has a regular circular shape. Furthermore, a center point P1 of the recess portion 72 exists at the same position in plane view as a center point P2 of the wall portion GND electrode 944.

In the second embodiment, the pair of excitation electrodes 23, 23 formed on the crystal oscillator piece 2 is disposed without being corresponding to and without being opposite to: the alternating current output terminal 831; the direct current power source terminal 832; the direct current control terminal 833; the GND terminal 834; the output line pattern 91; the power source line pattern 92; the control line pattern 93; and the GND line pattern 94.

The electrodes 8 of the base 5 are integrally baked with the base 5 after printing of metallization materials such as W and Mo. Among the electrodes 8, the electrode pads 81, 82, the external terminals 83 and the inspection terminals 84, 85 each have Ni plating formed over the corresponding metallized layer and Au plating formed over the corresponding Ni plating. Here, examples of the plating method include electrolytic plating and non-electrolytic plating.

As shown in FIG. 5, in the oscillator 1 in the above-described configuration, the IC chip 3 is disposed on the bottom portion 6 in the cavity 53 of the base 5. The IC chip 3 is electrically and mechanically connected to the electrode pads for the IC chip 3 via a conductive adhesive 14 by ultra sonic flip chip bonding (FCB). Furthermore, the crystal oscillator piece 2 is disposed on the bottom portion 6 in the cavity 53 of the base 5 so as to be aligned with the IC chip 3. The crystal oscillator piece 2 is electrically and mechanically connected to the electrode pads 81, 82 with the conductive adhesive 14.

Then, the lid 4 is disposed on the base 5 that includes the IC chip 3 and the crystal oscillator piece 2 mounted on the same plane, i.e. the bottom portion 6 of the cavity 53. After that, the sealing member 11 formed on the lid 4 is bonded to the first bonding layer of the base 5 by heat-melting, thus the oscillator 1 in which the crystal oscillator piece 2 and the IC chip 3 are hermetically sealed is fabricated, as shown in FIG. 4. The oscillator 1 thus fabricated is mounted on an external circuit board with a conductive adhesive such as a solder.

Figure 7:
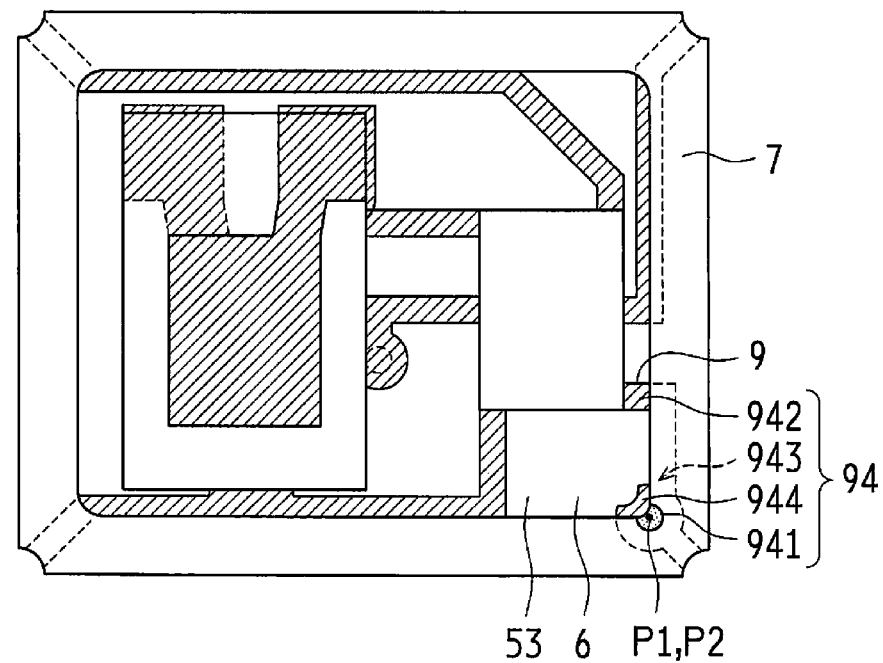
FIG. 7 is a schematic plane view of the base on which the crystal oscillator piece and the IC chip are mounted according to another aspect of the second embodiment of the present invention.

In the second embodiment as described above, the electronic component element GND line pattern 942 and the wall portion GND line pattern 941 are disposed adjacent to each other in the cavity 53. However, the present invention should not be limited thereto. As shown in FIG. 7, the electronic component element GND line pattern 942 and the wall portion GND line pattern 941 may be disposed spaced apart from each other in the cavity 53. In the line patterns 9 shown in FIG. 7, the connecting portion 943 is also disposed between the layers of the bottom portion 6 and the wall portion 7. For this reason, the electronic component element GND line pattern 942 and the wall portion GND line pattern 941 are not connected to each other in the cavity 53.

Thus, in the embodiment shown in FIG. 7, the connecting portion 943, which connects the electronic component element GND line pattern 942 to the wall portion GND line pattern 941, is disposed between the layers of the bottom portion 6 and the wall portion 7 in plane view of the base 5 (see FIG. 7), without being exposed in the cavity 53. The connecting portion 943, which appears as a part of the wall surface of the cavity 53, is not formed on the bottom portion 6 (the first main surface 51 of the base 5) in the cavity 53. However, in a few cases, the connecting portion 943 is formed not only on the wall portion 7 but also on the bottom portion 6 (the first main surface 51 of the base 5) in the cavity 53 due to manufacturing errors. In such a case also, it is possible to prevent the sealing member 11, which has spread on the wall portion GND line pattern 941, from spreading beyond the wall portion GND electrode 944.

Figure 8:
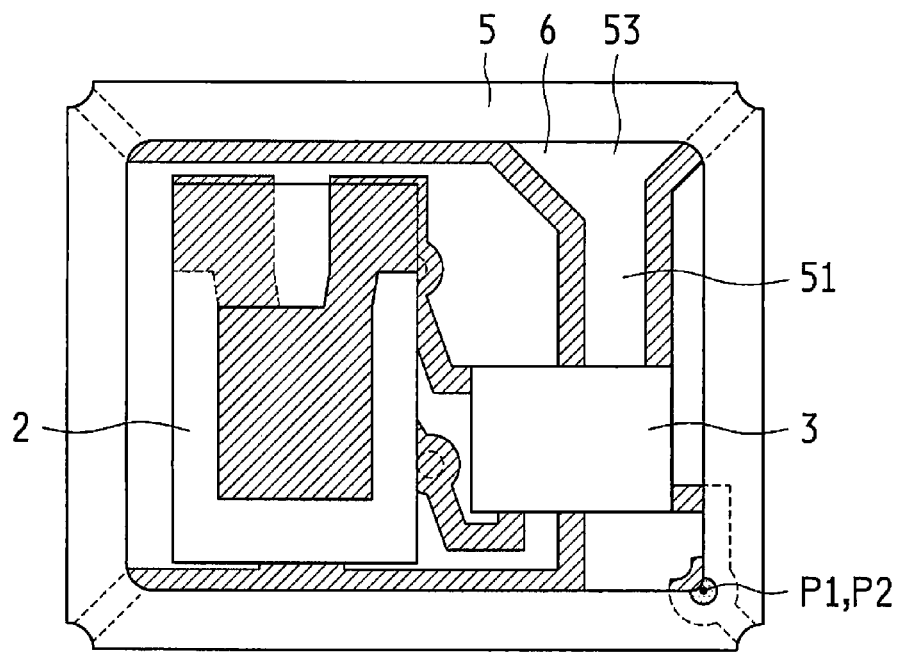
FIG. 8 is a schematic plane view of the base on which the crystal oscillator piece and the IC chip are mounted according to another aspect of the second embodiment of the present invention.

In the second embodiment as described above, the crystal oscillator piece 2 and the IC chip 3 are mounted side by side, with their long-side directions being in the same direction, on the bottom portion 6 (the first main surface 51 of the base 5) in the cavity 53. However, the present invention should not be limited thereto. The crystal oscillator piece 2 and the IC chip 3 may be mounted side by side, with the long-side direction of the crystal oscillator piece 2 and the short-side direction of the IC chip 3 being in the same direction, as shown in FIG. 8.

Figure 9:
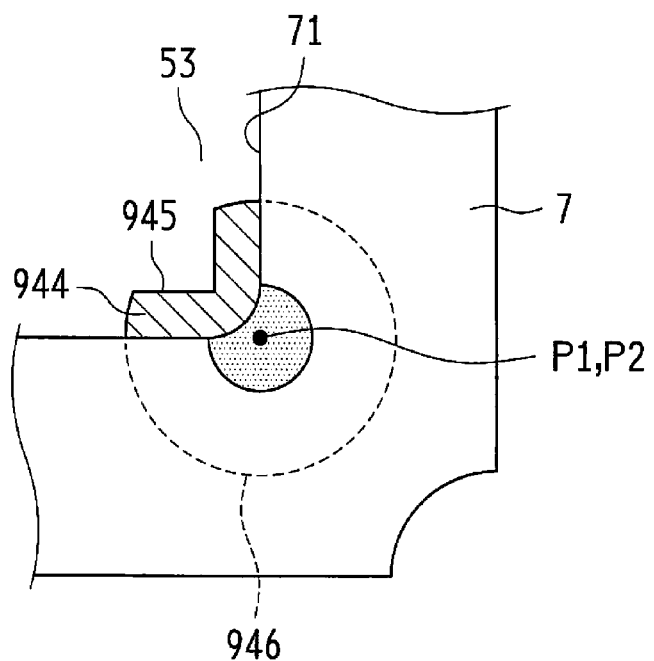
FIG. 9 is a partially enlarged schematic plane view of the base illustrating relation between a wall portion GND electrode pad and a recess portion according to another aspect of the first embodiment and the second embodiment of the present invention.

Also, in the first embodiment and the second embodiment as described. above, the exposed portion of the wall portion GND electrode 944 in the cavity 53 has a fan shape. The outer end edge of the exposed portion has a curved shape along the wall surface 71 of the wall portion 7 in the cavity 53. However, the above configuration simply indicates a preferable aspect to which the present invention should not be limited. Another aspect may be applied provided that the outer end edge of the exposed portion of the wall portion GND electrode 944 in the cavity 53 has a shape along the wall surface 71 of the wall portion 7 in the cavity 53. Specifically, as shown in FIG. 9, the exposed portion of the wall portion GND electrode 944 in the cavity 53 may have an L-shape, with the outer end edge 945 thereof being defined by two straight lines that have a bending point and are along the wall surface 71 of the wall portion 7 in the cavity 53.

Furthermore, in the first embodiment and the second embodiment as described above, the outer end edge 945 of the exposed portion of the wall portion GND electrode 944 in the cavity 53 has a curved shape along the wall surface 71 of the wall portion 7 in the cavity 53, while the outer end edge 946 of the non-exposed portion of the wall portion GND electrode 944 has a regular circular shape. However, the present invention should not be limited thereto. The outer end edge of the wall portion GND electrode 944 may have an ellipse shape as shown in FIG. 10 or a regular circular shape as shown in FIG. 11.

Figure 10:
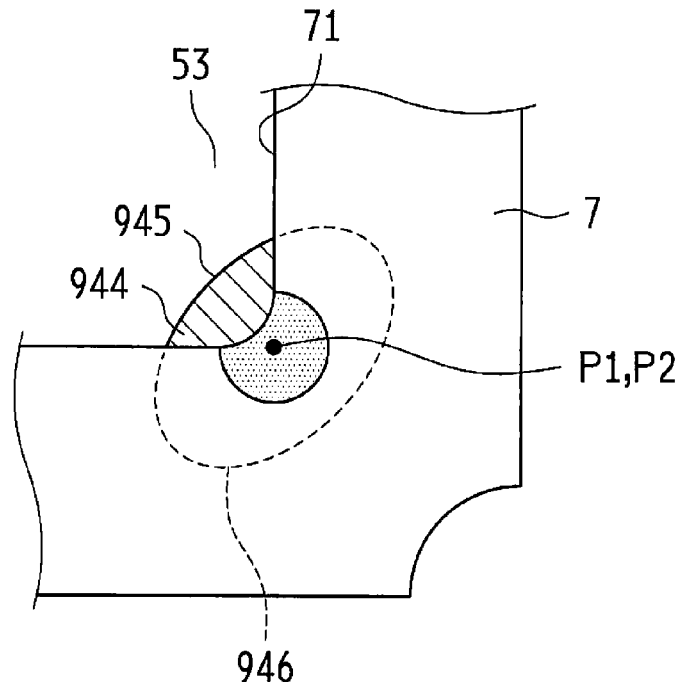
FIG. 10 is a partially enlarged schematic plane view of the base illustrating relation between a wall portion GND electrode pad and a recess portion according to another aspect of the first embodiment and the second embodiment of the present invention.

In the wall portion GND electrode 944 as shown in FIG. 10, the center point P1 of the recess portion 72 exists at the same position in plane view as the center point P2 of the wall portion GND electrode 944. The major axis of the ellipse is in the wall portion 7, while one minor axis of the ellipse is partially exposed in the cavity 53. In such a configuration therefore it is possible to reduce the exposed portion, in the cavity 53, of the wall portion GND electrode 944 in comparison with the configuration in which the outer end edges 945 and 946 of the wall portion GND electrode 944 have a regular circle shape having a radius equivalent to the major axis of the ellipse.

Figure 11:
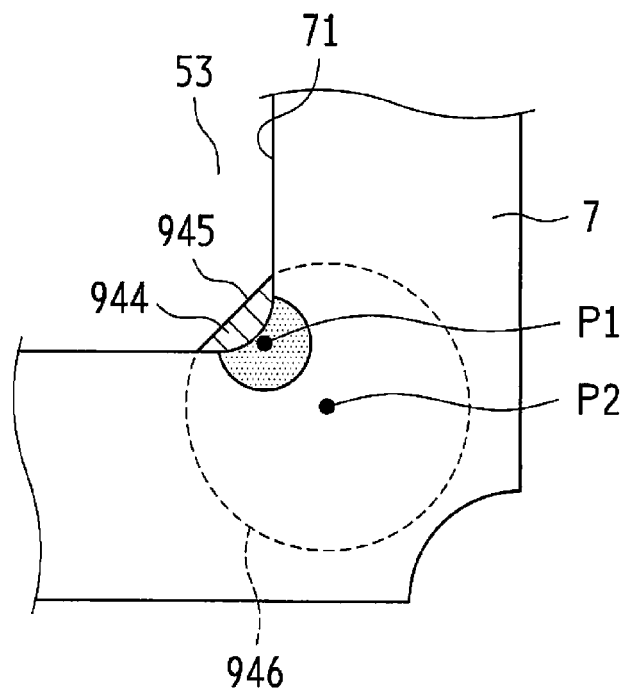
FIG. 11 is a partially enlarged schematic plane view of the base illustrating relation between a wall portion GND electrode pad and a recess portion according to another aspect of the first embodiment and the second embodiment of the present invention.

In the embodiment shown in FIG. 11, the center point P1 of the recess portion 72 does not exist at the same position in plane view as the center point P2 of the wall portion GND electrode 944. The center point P2 of the wall portion GND electrode 944 is located at the outer side of the cavity 53 relative to the center point P1 of the recess portion 72. In the present embodiment shown in FIG. 11, the outer end edge 945 of the exposed portion of the wall portion GND electrode 944 in the cavity 53 is a straight line, while the outer end edge 946 of the non-exposed portion of the wall portion GND electrode 944 has a circular shape.

In the above-described configurations of the wall portion GND electrode 944 as shown in FIGS. 10 and 11, it is possible to reduce the exposed portion, in the cavity 53, of the wall portion GND electrode 944 in comparison with the configuration in which the center point P1 of the recess portion 72 exists at the same position in plane view as the center point P2 of the wall portion GND electrode 944 and the outer shape of the wall portion GND electrode 944 has a regular circular shape. As a result, it is possible to ensure an internal clearance between the sealing member 11 that has spread, with a certain thickness, on the wall portion GND electrode 944, and the crystal oscillator piece 2 and the IC chip 3. Also, it is possible to space apart the wall portion GND electrode 944 from the line patterns for other uses (i.e. the output line pattern 91, the power source line pattern 92, the control line pattern 93 and the crystal line patterns 95, 96) and the electronic component elements (i.e. the crystal oscillator piece 2 and the IC chip 3).

Therefore, it is possible to prevent the sealing member 11 from making contact with the crystal oscillator piece 2 and the IC chip 3.

In the first embodiment and the second embodiment as described above, the crystal oscillator piece 2 and the IC chip 3 are disposed in the single cavity 53. However, the present invention should not be limited thereto. Two cavities may be formed so that the crystal oscillator piece 2 and the IC chip 3 are disposed in the respective cavities.

In the first embodiment and the second embodiment as described above, the recess portion 72 is formed in the wall surface 71 of the wall portion 7 in the cavity 53. In the recess portion 72, the wall portion GND line pattern 941, which includes the conductive member 15, is formed. However, the present invention should not be limited thereto. The wall portion GND line pattern 941 may be formed on the wall surface 71 of the wall portion 7 which is not provided with the recess portion 72.

The present invention may be embodied in a wide variety of forms other than those presented herein without departing from the spirit or essential characteristics thereof. The foregoing embodiments are therefore in all respects merely illustrative and are not to be construed in limiting fashion. The scope of the present invention being as indicated by the claims, it is not to be constrained in any way whatsoever by the body of the specification. All modifications and changes within the range of equivalents of the claims are, moreover, within the scope of the present invention.

Moreover, this application claims priority based on Patent Application No. 2011-133602 filed in Japan on 15 Jun. 2011. The entire contents thereof are hereby incorporated in this application by reference.

INDUSTRIAL APPLICABILITY

The present invention is suitable for piezoelectric resonator devices such as crystal oscillators, which have a lid made of a metal material and the like.

DESCRIPTION OF REFERENCE NUMERALS

1 Oscillator
11 Sealing member
12 Main body casing
13 Internal space
14 Conductive adhesive
15 Conductive member
2 AT-cut crystal oscillator piece
21 Substrate
22 Main surface
23 Excitation electrode
24 Extraction electrode
3 IC chip
4 Metal lid
5 Base
51 First main surface
52 Second main surface
53 Cavity
54 Castellation
55 Casing side surface
56 Via hole
6 Bottom portion
61 Bottom surface portion
62 Step portion
7 Wall portion
71 Wall surface
72 Recess portion 8 Electrode
81, 82 Electrode pads
83 External terminal
831 Alternating current output terminal
832 Direct current power source terminal
833 Direct current control terminal
834 GND terminal
84, 85 Inspection terminals
9 Line pattern
91 Output line pattern
92 Power source line pattern
93 Control line pattern
94 GND line pattern
941 Wall portion GND line pattern
942 Electronic component element GND line pattern
943 Connecting portion
944 Wall portion GND electrode
945, 946 Outer end edges of wall portion GND electrode
95, 96 Inspection line patterns
P1 Center point of recess portion
P2 Center point of wall portion GND electrode
P3 Center point of second main surface of base

The invention claimed is:

1. An electronic component package, comprising:
a base on which an electronic component element is mounted, the base including a bottom portion and a wall portion extending from the bottom portion; and
a lid bonded to the base with a sealing member so as to hermetically seal the electronic component element, the lid including a conductive member;
wherein the base includes:
a cavity formed on a first main surface of the base by the bottom portion and the wall portion, the cavity on which is mounted the electronic component element;
electrode pads electrically connected to electrodes of the electronic component element;
external terminals electrically connected to outside; and
line patterns electrically connected to the electrode pads and the external terminals,
wherein the external terminals include a GND terminal for grounding,
wherein the line patterns include:
a wall portion GND line pattern formed on the wall portion to be exposed in the cavity so as to connect the lid to the GND terminal; and
an electronic component element GND line pattern formed on the first main surface of the base in the cavity so as to connect the electronic component element to the GND terminal, and
wherein a connecting portion that connects the electronic component element GND line pattern to the wall portion GND line pattern is disposed between layers of the bottom portion and the wall portion in plane view of the base, without presenting a surface to the cavity, and wherein surfaces of the connecting portion are covered by the bottom portion and the wall portion.

2. The electronic component package according to claim 1, wherein the connecting portion is disposed between layers of the bottom portion and the wall portion, without being exposed in the cavity.

3. The electronic component package according to claim 1, wherein a recess portion is provided in a wall surface of the wall portion in the cavity, and
wherein the wall portion GND line pattern is formed in the recess portion.

4. The electronic component package according to claim 3, wherein a wall portion GND electrode is formed on the bottom portion, the wall portion GND electrode being a part of the wall portion GND line pattern,
wherein a portion of the wall portion GND electrode is exposed in the cavity,
wherein an outer end edge of the exposed portion of the wall portion GND electrode in the cavity has a shape along the wall surface of the wall portion in the cavity, and
wherein an outer end edge of a non-exposed portion of the wall portion GND electrode has a circular shape.

5. The electronic component package according to claim 3, wherein a wall portion GND electrode is formed on the bottom portion, the wall portion GND electrode being a part of the wall portion GND line pattern,
wherein an outer end edge of the wall portion GND electrode has an ellipse shape, and
wherein one minor axis of the ellipse is partially exposed in the cavity.

6. The electronic component package according to claim 3, wherein a wall portion GND electrode is formed on the bottom portion, the wall portion GND electrode being a part of the wall portion GND line pattern,
wherein a portion of the wall portion GND electrode is exposed in the cavity,
wherein an outer end edge of the exposed portion of the wall portion GND electrode in the cavity is a straight line, and
wherein an outer end edge of a non-exposed portion of the wall portion GND electrode has a circular shape.

7. A piezoelectric resonator device,
wherein a piezoelectric element as an electronic component element is hermetically sealed in the electronic component package according to claim 1.

8. An electronic component package, comprising:
a laminated base having a cavity therein and composed of a bottom portion having an electronic-component mounting surface, and an enclosing wall portion extending from the electronic-component mounting surface;
external electrical-connection terminals formed exteriorly on the base, the external terminals including a grounding external terminal;
an electroconductive lid bonded to the wall portion of the base so as to hermetically seal into the cavity in the base an electronic component mounted on the electronic-component mounting surface;
a wall-portion grounding metallization line formed in the wall portion of the base and electrically connected to the electroconductive lid via sealant-bonding to the wall portion of the base, with the grounding external terminal on the base exterior, and such as to be exposed to the cavity in the base; and
metallization formed integrally with the bottom portion of the base, the metallization including
electrode pads exposed on the electronic-component mounting surface, for forming electrical connections with electronic-component electrodes,
metallization lines electrically connecting the electrode pads and external terminals other than the grounding external terminal,
an electronic-component grounding metallization line for electrically connecting an electronic component mounted in the cavity in the base with the grounding external terminal, and
a connecting portion that lacks a surface in the cavity and that electrically connects the electronic-component grounding metallization line with the wall-portion grounding metallization line, the connecting portion being disposed between, when the base is seen in planar view, laminations of the bottom and wall portions of the base.

9. The electronic component package according to claim 8, wherein:
- a recess portion is provided in a cavity wall surface of the enclosing wall portion of the base; and
- the wall-portion grounding metallization line is formed in the recess portion.

10. The electronic component package according to claim 9, wherein the wall-portion grounding metallization line comprises a wall-portion grounding electrode having an exposed portion exposed to the cavity in the base, the remainder of the grounding electrode being a non-exposed portion, the exposed portion having a shaped outer edge along the cavity wall surface of the enclosing wall portion of the base, and the non-exposed portion having a circular outer edge.

11. The electronic component package according to claim 9, wherein the wall-portion grounding metallization line comprises a wall-portion grounding electrode of elliptical form, a minor-axis portion of the elliptical grounding electrode being partially exposed to the cavity in the base.

12. The electronic component package according to claim 9, wherein the wall-portion grounding metallization line comprises a wall-portion grounding electrode having an exposed portion exposed to the cavity in the base, the remainder of the grounding electrode being a non-exposed portion, the exposed portion being rectilinear, and the non-exposed portion having a circular outer edge.

13. A piezoelectric resonator device, wherein a piezoelectric element as an electronic component element is hermetically sealed in the electronic component package according to claim 8.

* * * * *